US006686239B2

(12) United States Patent
Nam et al.

(10) Patent No.: US 6,686,239 B2
(45) Date of Patent: Feb. 3, 2004

(54) CAPACITORS OF SEMICONDUCTOR DEVICES AND METHODS OF FABRICATING THE SAME

(75) Inventors: Yoon-Suk Nam, Seongnam (KR); Duck-Hyung Lee, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/320,030

(22) Filed: Dec. 16, 2002

(65) Prior Publication Data

US 2003/0129799 A1 Jul. 10, 2003

(30) Foreign Application Priority Data

Jan. 4, 2002 (KR) ............................................. 2002-452

(51) Int. Cl.$^7$ ...................... H01L 21/8242; H01L 23/52
(52) U.S. Cl. ...................... 438/244; 438/387; 438/622; 438/240; 257/760; 257/761
(58) Field of Search ................................. 438/244, 253, 438/240, 387, 396, 450, 622–629, 652, 642–648, 672–675; 257/758–766

(56) References Cited

U.S. PATENT DOCUMENTS

| 5,292,677 A | * | 3/1994 | Dennison ..................... 437/52 |
| 6,017,790 A | * | 1/2000 | Liou et al. ................... 438/240 |
| 6,025,226 A | * | 2/2000 | Gambino et al. ........... 438/244 |
| 6,069,051 A | * | 5/2000 | Nguyen et al. ............. 438/396 |
| 6,441,419 B1 | * | 8/2002 | Johnson et al. ............. 257/296 |
| 6,617,635 B2 | * | 9/2003 | Parekh et al. ............... 257/306 |

* cited by examiner

Primary Examiner—Caridad Everhart
Assistant Examiner—Calvin Lee
(74) Attorney, Agent, or Firm—Mills & Onello, LLP

(57) ABSTRACT

A capacitor is disposed on a semiconductor substrate and includes an interlayer dielectric layer pattern with first and second openings, which expose the semiconductor substrate in predetermined regions, respectively. A sidewall and a bottom of the first opening are covered with a first lower electrode, and a sidewall and a bottom of the second opening is covered with a second lower electrode. Inner walls of the first and second lower electrodes are covered with an upper dielectric layer. The upper dielectric layer is covered with first and second upper electrodes at the first and second openings, respectively. A lower dielectric layer pattern intervenes between the second lower electrode and the upper dielectric layer. The method includes forming and patterning an interlayer dielectric layer on a semiconductor substrate, thereby forming an interlayer dielectric layer pattern with first and second openings, which expose the semiconductor substrate, respectively. First and second lower electrodes are formed on the first and second openings. A lower dielectric layer pattern is then formed to cover the second lower electrode. Thereafter, an upper dielectric layer and an upper electrode layer are sequentially formed on an entire surface of the semiconductor substrate including the lower dielectric layer pattern.

20 Claims, 5 Drawing Sheets

Memory Region | Logic Circuit Region

Memory Region | Logic Circuit Region

CAPACITORS OF SEMICONDUCTOR DEVICES AND METHODS OF FABRICATING THE SAME

RELATED APPLICATION

This application relies for priority upon Korean Patent Application No. 2002-00452, filed on Jan. 4, 2002, the contents of which are herein incorporated by reference in their entirety.

FIELD OF THE INVENTION

The present invention relates to semiconductor devices and methods of fabricating the same and, more particularly, to semiconductor devices with capacitors of a metal-insulator-metal (MIM) structure (hereinafter inclusively referred as an MIM capacitor), and methods of fabricating the same.

BACKGROUND OF THE INVENTION

In order to minimize the fabrication costs of semiconductor devices, it is preferred that the semiconductor devices be highly integrated and that the number of fabricating steps be reduced. As portable electronic devices such as cellular telephones, camcorders, and electronic game machines have increased in popularity, there has evolved a heightened need for embedded memory logic (EML) semiconductor devices that include both memory and logic circuits. Such EML semiconductor devices generally employ DRAMs as memories for high-speed operations.

FIG. 1 is a cross-sectional view for illustrating a method of fabricating a capacitor of a typical DRAM semiconductor device.

Referring to FIG. 1, a first interlayer dielectric layer (ILD) is formed on the semiconductor device 10. Thereafter, the first ILD is patterned to form a first interlayer dielectric layer pattern (ILD pattern) 20 with a first opening 25 exposing the semiconductor device 10. A conductive contact plug 30 is formed through the first opening 25 to be connected to the semiconductor substrate 10. At this time, the first ILD pattern 20 covers a gate pattern (not shown) formed on the semiconductor substrate.

A second ILD is formed on an entire surface of the semiconductor substrate including the contact plug 30. Thereafter, the second ILD is patterned to form a second ILD 40 with a second opening 45 exposing a top surface of the contact plug 30.

A lower electrode layer and a sacrificial layer (not shown) are conformally formed on an entire surface of the semiconductor substrate including the second ILD pattern 40. Next, the sacrificial layer and the lower electrode layer are etched to expose a top surface of the second ILD pattern 40, thereby forming a lower electrode 50 and a sacrificial layer pattern, which sequentially fill the second opening 45. The sacrificial layer pattern is then removed to expose an inner wall of the lower electrode 50.

A dielectric layer 60 and an upper electrode layer are sequentially formed on an entire surface of the semiconductor substrate including the exposed lower electrode 50. The upper electrode layer is patterned to expose a top surface of the dielectric layer 60, thereby forming an upper electrode 70, which fills the second opening 45 and crosses thereon.

Fabrication of a DRAM capacitor according to the foregoing conventional method comprises performing the photolithographic and etching processes three times in order to form the first opening 25, the second opening 45, and the upper electrode 70.

In addition, as shown in FIG. 1, a DRAM cell capacitor typically includes a lower electrode having a height $h_1$ of about 10000 Å and higher, so as to enable high integration and to secure a sufficient capacitance value. However, because the height $h_1$ of the lower electrode 50 is relatively high, fabricating processes of DRAMs are incompatible with those of logic circuits. In addition, a higher voltage may be applied to the capacitors for logic circuits than the capacitors for memories. Thus, the capacitors for the logic circuits generally include thicker capacitor dielectric layers so as to have a sufficient breakdown voltage as compared with the capacitors for the memories. As a result, the capacitors for logic circuits are fabricated to have a different thickness through different process steps than that of the capacitors of memories, complicating production, and therefore leading to higher fabrication costs.

SUMMARY OF THE INVENTION

It is therefore a feature of the present invention to provide semiconductor devices with capacitors for logic circuits and capacitors for DRAMs, having structures that are similar to each other, so as to be suitable for fabricating EML semiconductor devices.

It is another feature of the present invention to provide methods of fabricating capacitors of semiconductor devices, which are suitable for EML semiconductor devices and which can reduce fabrication costs.

In this manner, a capacitor structure and method are provided for decreasing the number of the photolithographic and etching processes to realize process simplification and reduce associated costs in the fabrication of semiconductor device capacitors.

In accordance with a feature of the present invention, provided is a capacitor of a semiconductor device in which capacitors for logic circuits and capacitors for DRAMs are disposed in an interlayer dielectric layer (ILD) covering gate patterns. The capacitor includes an interlayer dielectric layer pattern (ILD pattern) that is disposed over a semiconductor substrate including a memory region and a logic circuit region, and has first and second openings exposing the semiconductor substrate of the memory and logic circuit regions, respectively. A sidewall and a bottom of the first opening are covered with a first lower electrode, and a sidewall and a bottom of the second opening are covered with a second lower electrode. Inner walls of the first and second lower electrodes are covered with an upper dielectric layer. The upper dielectric layer is covered with first and second upper electrodes at the first and second openings, respectively. A lower dielectric layer pattern is intervened between the second lower electrode and the upper dielectric layer.

Preferably, the lower dielectric layer pattern and the upper dielectric layer are formed of at least one material selected from the group consisting of a tantalum oxide layer ($Ta_2O_5$), an aluminum oxide layer ($Al_2O_3$), a titanium oxide layer ($TiO_2$), a silicon oxide layer ($SiO_2$), a silicon nitride layer ($Si_3N_4$), and a hafnium oxide layer ($HfO_2$).

In addition, the first and second upper electrodes are preferably composed of at least one material selected from the group consisting of titanium nitride, titanium, cobalt, tungsten, and ruthenium. Likewise, the first and second lower electrodes are preferably composed of at least one material selected from the group consisting of titanium nitride, titanium, cobalt, tungsten, tungsten, and ruthenium.

It is preferable that a heavily doped region is additionally disposed in the semiconductor substrate under the first and second openings.

In accordance with another feature of the present invention, provided is a method of fabricating a capacitor of a semiconductor device comprising selectively removing a lower dielectric layer formed in a memory region. The method comprises forming an ILD on a semiconductor substrate including memory and logic circuit regions and patterning the resultant structure. As a result, an ILD pattern is formed to have first and second openings exposing the semiconductor substrate of the memory and logic circuit regions, respectively. Thereafter, first and second lower electrodes are formed in the first and second openings, respectively. After forming a lower dielectric layer pattern covering the second lower electrode, an upper dielectric layer and an upper electrode are sequentially formed on an entire surface of the resultant structure.

Preferably, before forming the ILD, a heavily doped region is formed in the semiconductor substrate under the first and second openings.

The first and second lower electrodes are preferably composed of at least one selected from the group consisting of titanium nitride, titanium, cobalt, tungsten, and ruthenium.

Forming the first and second lower electrodes comprises sequentially stacking a lower electrode layer and a sacrificial layer on an entire surface of the semiconductor substrate where the first and second openings are formed, successively etching the sacrificial layer and the lower electrode layer to expose a top surface of the ILD pattern, and removing the sacrificial layer. In this case, the sacrificial layer is preferably composed of at least one material selected from SOG materials and photoresist materials. The sacrificial layer is preferably removed by a wet etch process using an etch recipe having an etch selectivity with respect to the ILD, and first and second lower electrodes.

Forming the lower dielectric layer pattern comprises conformally forming a lower dielectric layer on an entire surface of the semiconductor substrate where the first and second lower electrodes are formed, forming a mask pattern covering the lower dielectric layer disposed on the second lower electrode, and removing the lower dielectric layer covering the first lower electrode by using the mask pattern as an etch mask. Preferably, the lower dielectric layer covering the first lower electrode is removed by an isotropic etch process using an etch recipe having an etch selectivity with respect to the first lower electrode and the ILD pattern.

The lower dielectric layer pattern preferably comprises at least one material selected from the group consisting of a tantalum oxide layer ($Ta_2O_5$), an aluminum oxide layer ($Al_2O_3$), a titanium oxide layer ($TiO_2$), a silicon oxide layer ($SiO_2$), a silicon nitride layer ($Si_3N_4$), and a hafnium oxide layer ($HfO_2$).

Likewise, the upper dielectric layer is preferably at least one material selected from the group consisting of a tantalum oxide layer ($Ta_2O_5$), an aluminum oxide layer ($Al_2O_3$), a titanium oxide layer ($TiO_2$), a silicon oxide layer ($SiO_2$), a silicon nitride layer ($Si_3N_4$), and a hafnium oxide layer ($HfO_2$).

The upper electrode layer preferably comprises a material selected from the group consisting of titanium nitride, titanium, cobalt, tungsten, and ruthenium.

After forming the upper electrode layer, the upper electrode layer is preferably patterned to form first and second upper electrodes that cross the first and second openings, respectively.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
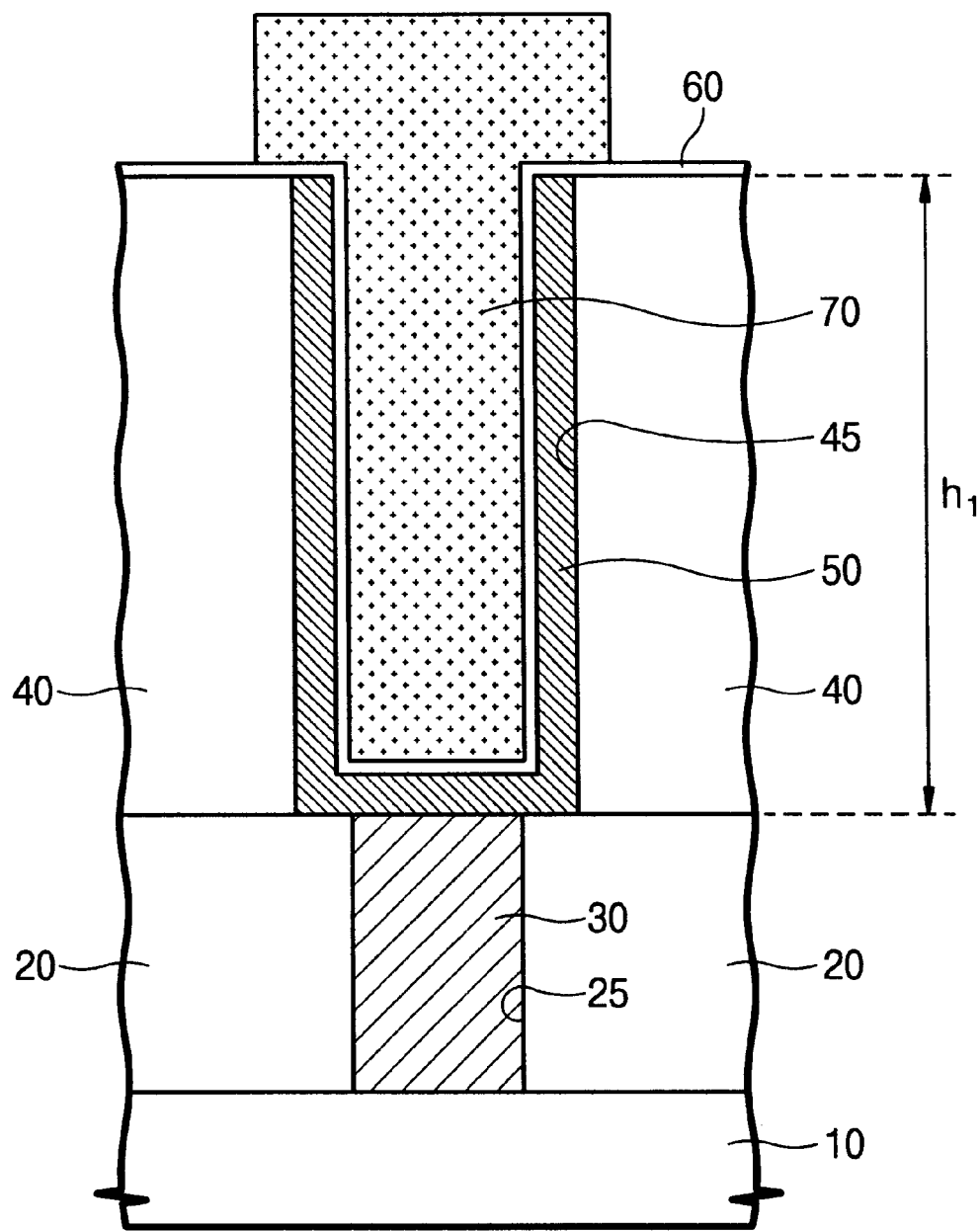
FIG. 1 is a cross-sectional view for illustrating a method of fabricating a capacitor of a conventional DRAM semiconductor device.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

FIGS. 2 through 7 are cross-sectional views for illustrating a method of fabricating a capacitor of a semiconductor device according to a preferred embodiment of the present invention.

Figure 2:
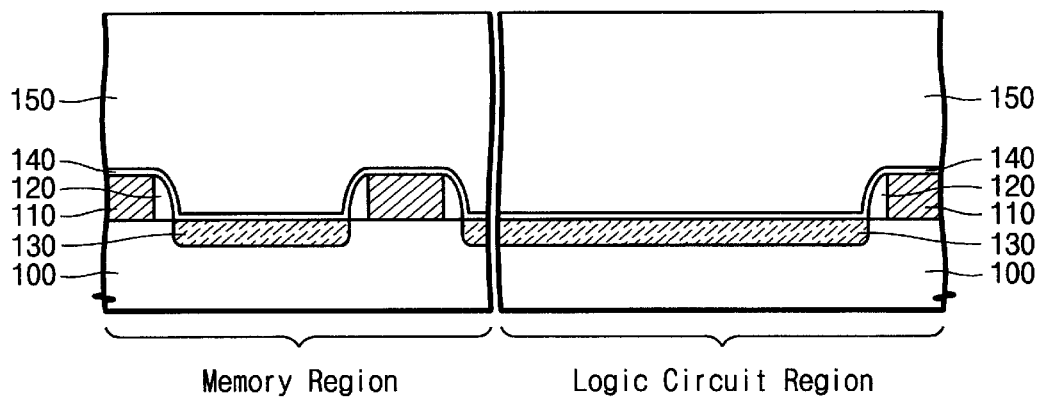
FIGS. 2 through 7 are cross-sectional views for illustrating a method of fabricating a capacitor of a semiconductor device according to a preferred embodiment of the present invention.

Referring to FIG. 2, a device isolation layer (not shown) is formed at a predetermined region of a semiconductor substrate 100 including a memory region and a logic circuit region to define an active region. A gate pattern 110 is formed on the semiconductor substrate including the device isolation layer. Thereafter, a spacer 120 is formed on a sidewall of the gate pattern 110. An ion implantation process is performed by using the spacer 120 as a mask to form a heavily doped region 130 in the active region. An etch stop layer 140 and an interlayer dielectric layer (ILD) are formed on an entire surface of the semiconductor substrate including the heavily doped region 130.

The ILD 150 is preferably a silicon oxide layer. Also, the etch stop layer 140 is composed of a material having an etch selectivity with respect to the ILD 150. For this, the etch stop layer 140 is preferably a silicon nitride layer or a silicon oxynitride layer.

Figure 3:
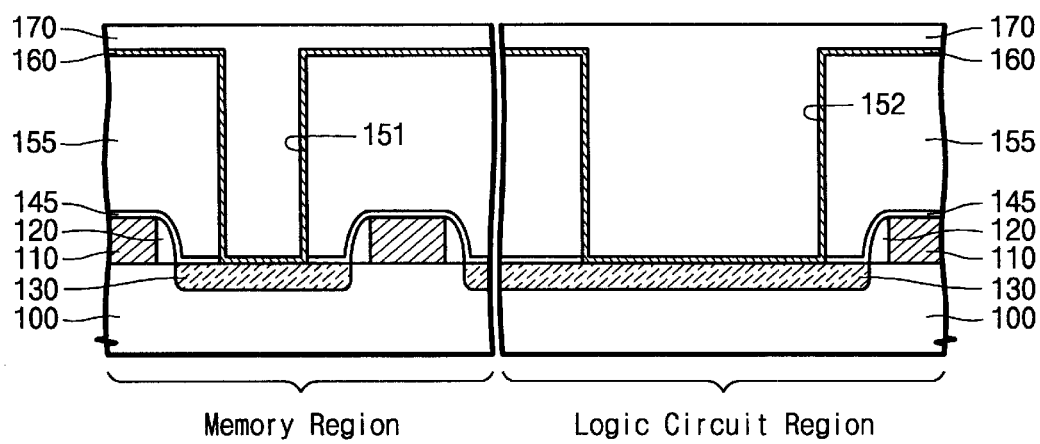

Referring to FIG. 3, the ILD 150 and the etch stop layer 140 are successively patterned to form an interlayer dielectric layer pattern (ILD pattern) 155 and an etch stop layer pattern 145, which include first and second openings 151 and 152. At this time, the first and second openings 151 and 152 expose a top surface of the heavily doped region 130 at the memory region and the logic circuit region, respectively.

The etch process for forming the first and second openings 151 and 152 preferably comprises etching the ILD 150 using an etch recipe having an etch selectivity with respect to the etch stop layer 140, then etching the etch stop layer 140 using an etch recipe having an etch selectivity with respect to the semiconductor substrate 100.

A lower electrode layer 160 is conformally formed on an entire surface of the semiconductor substrate including the first and second openings 151 and 152. The lower electrode layer 160 is preferably a titanium layer and a titanium nitride layer, which are sequentially stacked. In addition to the titanium and titanium nitride, the lower electrode layer 160 may further use at least one selected from the group consisting of cobalt, tungsten, and ruthenium. Formation of the lower electrode layer 160 is preferably followed by performing a thermal process so as to enable the lower electrode layer 160 and the semiconductor substrate 100 to form an ohmic contact.

A sacrificial layer 170 is formed on an entire surface of the semiconductor substrate including the lower electrode layer 160. The sacrificial layer 170 is formed to meet the convenience of a subsequent planarizing etch process. Accordingly, the sacrificial layer 170 is preferably composed of a material that can minimize etching of the ILD pattern 155 and the lower electrode layer 160 during the subsequent etching process for removing the sacrificial layer 170. Thus, the sacrificial layer 170 is preferably composed of a material selected from SOG materials and photoresist materials.

Figure 4:
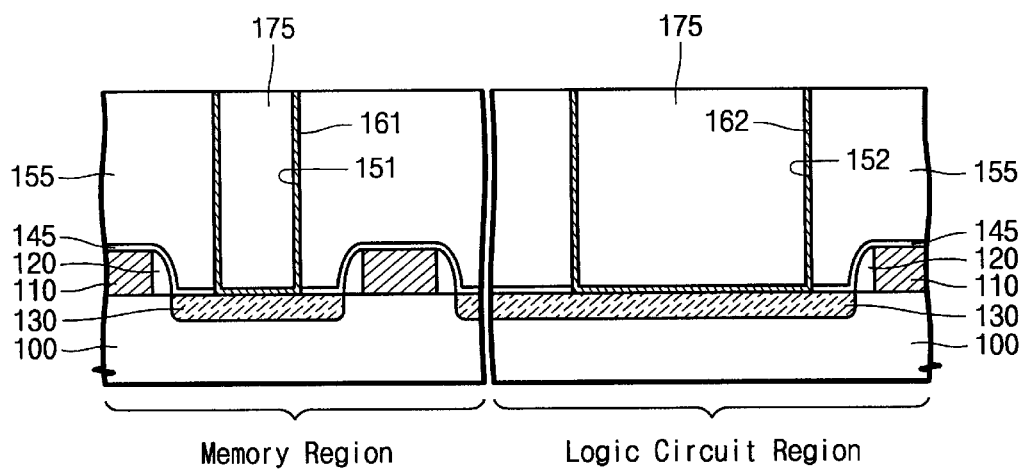

Referring to FIG. 4, the sacrificial layer 170 and the lower electrode layer 160 are successively etched until a top surface of the ILD pattern 155 is exposed, thereby separating the lower electrodes of the memory region and the logic circuit region.

Thus, the lower electrode layer 160 is etched to form first and second lower electrodes 161 and 162, which cover a sidewall and a bottom of the first and second openings 151 and 152, respectively.

In addition, the sacrificial layer 170 is also etched during the process for separating the lwer electrode to form a sacrificial layer pattern 175, which fills the regions defined by the first and second lower electrodes 161 and 162.

The etchback process for separating the lower electrodes preferably employs a chemical mechanical polishing (CMP) process.

Figure 5:
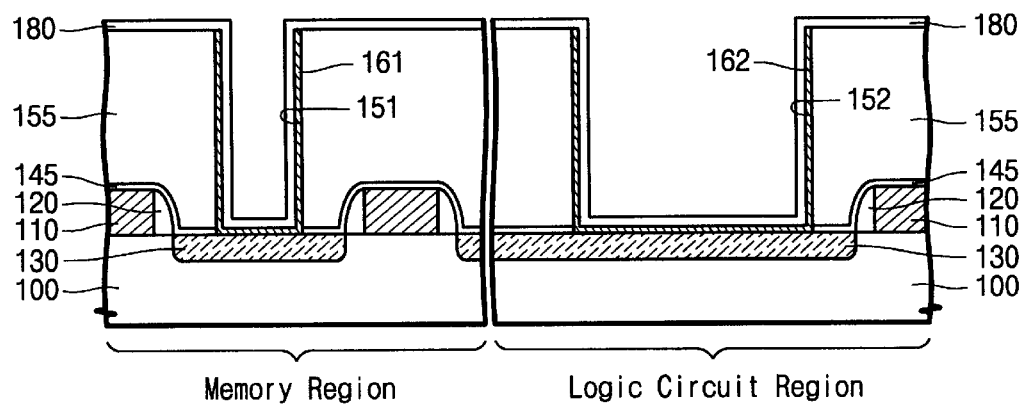

Referring to FIG. 5, the sacrificial layer pattern 175 is removed to expose inner walls of the first and second lower electrodes 161 and 162. Thereafter, a lower dielectric layer 180 is formed to cover the inner walls of the exposed first and second lower electrodes 161 and 162 as well as a top surface of the ILD pattern 155.

The sacrificial layer pattern 175 is removed using an etch recipe having an etch selectivity with respect to the first and second lower electrodes 161 and 162, and the ILD pattern 155. In addition, the sacrificial layer pattern 175 is preferably removed using a wet etch process such that the first and second lower electrodes 161 and 162 do not suffer from etch damage due to plasma.

The lower dielectric layer 180 is preferably selected from the group of layer materials consisting of a tantalum oxide layer ($Ta_2O_5$), an aluminum oxide layer ($Al_2O_3$), a titanium oxide layer ($TiO_2$), a silicon oxide layer ($SiO_2$), a silicon nitride layer ($Si_3N_4$), and a hafnium oxide layer ($HfO_2$). In other embodiments, the lower dielectric layer 180 may comprise a material selected from the group consisting of $ZrO_2$, $Nb_2O_5$, $CeO_2$, $Y_2O_3$, $InO_3$, $IrO_2$, $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, and $(Sr,Ca)RuO_3$.

In this case, the lower dielectric layer 180 is formed to have a thickness corresponding to a difference between the predetermined thickness of the dielectric layer of the capacitor for logic circuits and the predetermined thickness of the dielectric layer of the capacitor for DRAMs.

Figure 6:
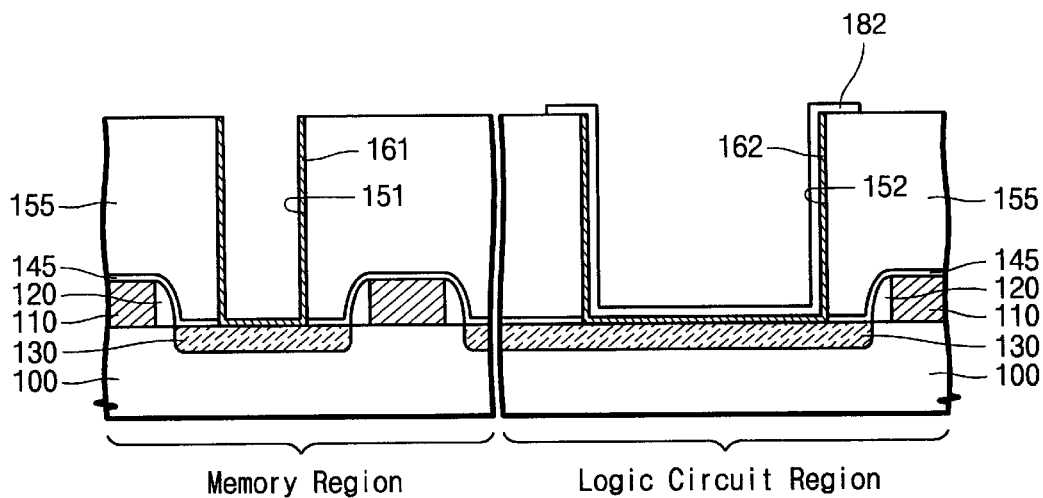

Referring to FIG. 6, a photoresist pattern (not shown) is formed on the lower dielectric layer 180 to cover a top surface of the second opening 152. Thus, the photoresist pattern exposes the lower dielectric layer 180 of the memory region. Thereafter, the exposed lower dielectric layer 180 of the memory region is etched by using the photoresist pattern as an etch mask to form a lower dielectric layer pattern 182 covering the second lower electrode 162. Thus, the ILD pattern 155 and the first lower electrode 161 of the memory region are exposed. The photoresist pattern is then removed.

Preferably, the lower dielectric layer 180 is etched using an etch recipe having an etch selectivity with respect to the ILD pattern 155 and the first lower electrode 161. In addition, the etch process is preferably an isotropic process using a wet etching.

Figure 7:
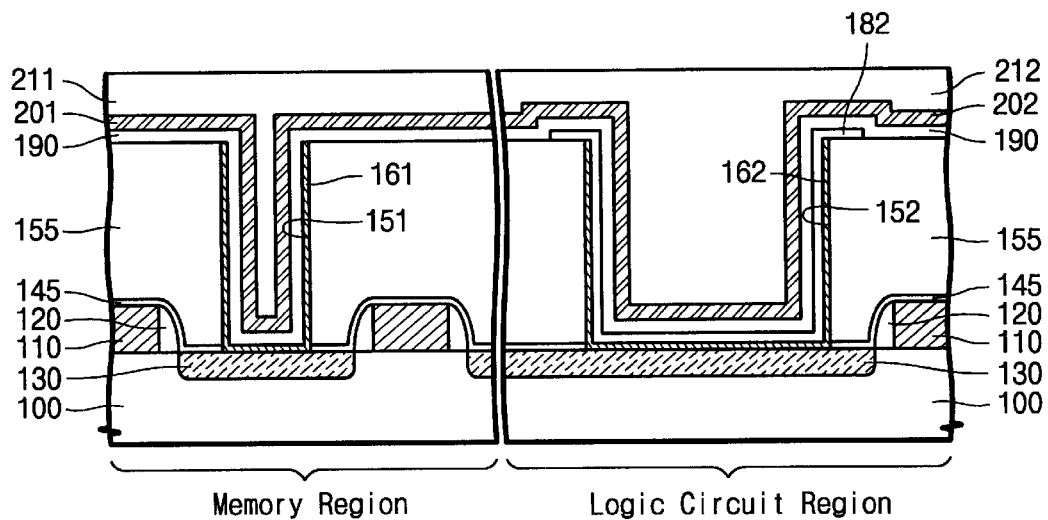

Referring to FIG. 7, an upper dielectric layer 190, an upper electrode layer (not shown), and a gap fill material layer (not shown) are sequentially formed on an entire surface of the semiconductor substrate including the lower dielectric layer pattern 182. Thereafter, the gap fill material layer and the upper electrode layer are successively patterned to form a first upper electrode 201 and a first gap fill pattern 211 crossing the first opening 151 as well as a second upper electrode 202 and a second gap fill pattern 212 crossing the second opening 152.

Like the lower dielectric layer 180, the upper dielectric layer 190 is preferably formed of a material selected from the group consisting of a tantalum oxide. layer ($Ta_2O_5$), an aluminum oxide layer ($Al_2O_3$), a titanium oxide layer ($TiO_2$), a silicon oxide layer ($SiO_2$), a silicon nitride layer ($Si_3N_4$), and a hafnium oxide layer ($HfO_2$). Alternatively, the upper dielectric layer 190 may be composed of a material selected from the group consisting of $ZrO_2$, $Nb_2O_5$, $CeO_2$, $Y_2O_3$, $InO_3$, $IrO_2$, $SrTiO_3$, $PbTiO_3$, $SrRuO_3$, $CaRuO_3$, $(Ba,Sr)TiO_3$, $Pb(Zr,Ti)Q_3$, $(Pb,La)(Zr,Ti)O_3$, and $(Sr,Ca)RuO_3$.

Also, the upper electrode layer is preferably composed of at least one material selected from titanium, titanium nitride, cobalt, tungsten, and ruthenium.

The gap fill material layer is formed to fill remaining spaces of the first and second openings 151 and 152 where the upper electrode layer is formed. The gap fill material layer is preferably composed of tungsten, however, a silicon oxide layer may alternatively be used for the gap fill material layer.

The gap fill material layer and the upper electrode layer are preferably patterned using an etch recipe having an etch selectivity with respect to the upper dielectric layer 190. However, in the event that the patterning process is carried out without stability, a conductive path may be formed between the adjacent upper electrodes 201 and 202. To minimize such a bridge phenomenon, the patterning process employs an over-etching. Thus, the upper dielectric layer 190 may be etched until a top surface of the ILD pattern 155 is exposed.

Figure 8A:
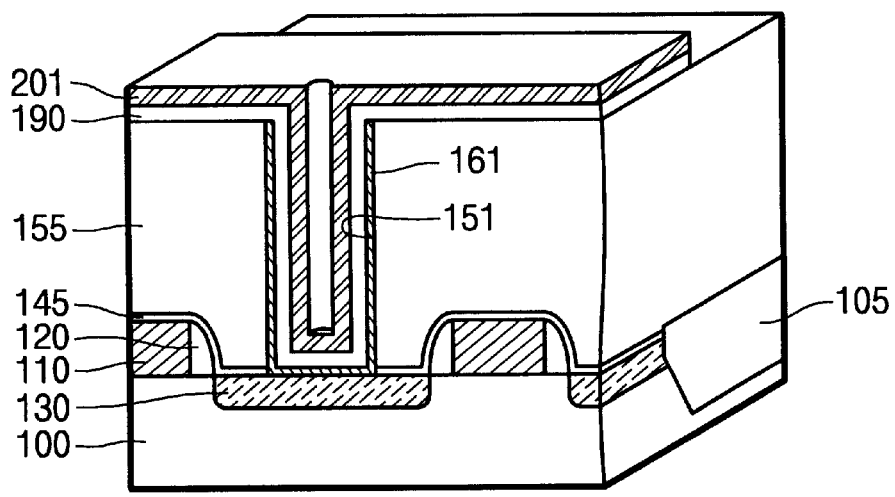
FIGS. 8A and 8B are perspective views of the capacitor of the semiconductor device.
Figure 8B:
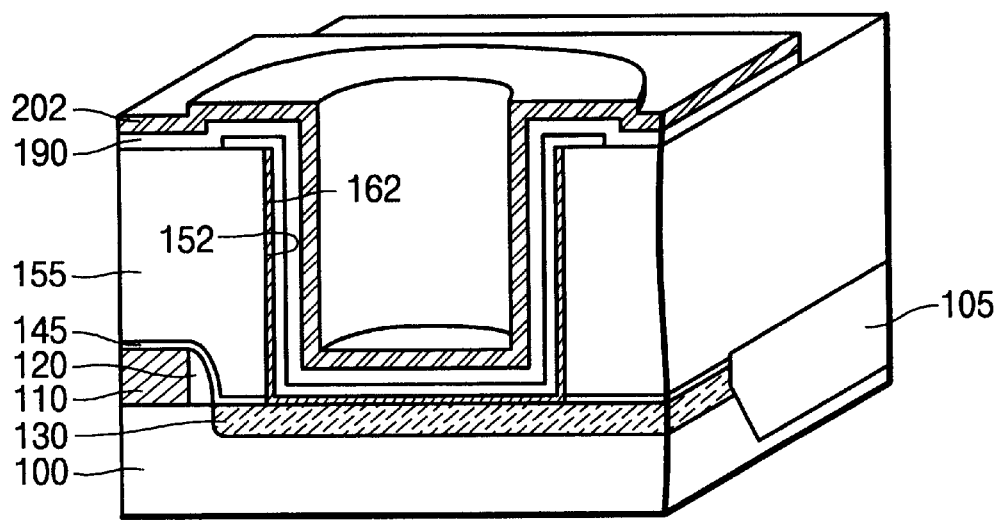

FIGS. 8A and 8B are perspective views of capacitors of a semiconductor device, which are disposed in a memory region and a logic circuit region, respectively, according to the preferred embodiment of the present invention.

Referring to FIGS. 8A and 8B, a device isolation layer 105 is disposed at a predetermined region of a semiconductor substrate 100 including a memory region and a logic circuit region to define an active region. A gate pattern 110 is disposed on the active region to cross the device isolation layer 105 and the active region. Spacers 120 are disposed on both sidewalls of the gate pattern 110. A heavily doped region 130 is disposed in the active region between the spacers 120.

An ILD 155 is disposed on an entire surface of the semiconductor substrate including the gate pattern 110 and the spacer 120. The ILD 155 includes first and second openings 151 and 152 exposing the heavily doped region 130. The first opening 151 is disposed in the memory region, and the second opening 152 is disposed in the logic circuit region. An etch stop layer 140 is preferably disposed under the ILD pattern 155. The ILD pattern 155 is preferably a silicon oxide layer, and the etch stop layer 140 is preferably a material layer having an etch selectivity with respect to the ILD pattern 155.

A first lower electrode 161, an upper dielectric layer 190, and a first upper electrode 201 are sequentially stacked on an inner wall of the first opening 151. A second lower electrode 162, a lower dielectric layer pattern 182, the upper dielectric layer 190, and a second upper electrode 202 are sequentially stacked on an inner wall of the second opening 152. Thus, the capacitor of the logic circuit region may include a thicker insulation layer than that of the memory region. At this time, the upper dielectric layer 190 is disposed both in the memory region and the logic circuit region. Accordingly, the dielectric layer of the capacitor for logic circuits is thicker than that of the capacitor for DRAMs by the thickness of the lower dielectric layer pattern 182.

The first and second lower electrodes 161 and 162 are preferably composed of at least one selected from the group consisting of titanium nitride, titanium, cobalt, tungsten, and ruthenium. Likewise, the first and second upper electrodes 201 and 202 are preferably composed of at least one selected from the group consisting of titanium nitride, titanium, cobalt, tungsten, and ruthenium.

The lower dielectric layer pattern 182 is preferably formed of at least one material selected from the group consisting of a tantalum oxide layer ($Ta_2O_5$), an aluminum oxide layer ($Al_2O_3$), a titanium oxide layer ($TiO_2$), a silicon oxide layer ($SiO_2$), a silicon nitride layer ($Si_3N_4$), and a hafnium oxide layer ($HfO_2$). The upper dielectric layer 190 and the lower dielectric layer pattern 182, preferably formed of at least one material selected from the group consisting of a tantalum oxide layer ($Ta_2O_5$), an aluminum oxide layer ($Al_2O_3$), a titanium oxide layer ($TiO_2$), a silicon oxide layer ($SiO_2$), a silicon nitride layer ($Si_3N_4$), and a hafnium oxide layer ($HfO_2$). In addition, the lower dielectric layer pattern 182 and the upper dielectric layer 190 may be composed of a material selected from the group consisting of $ZrO_2$, $Nb_2O_5$, $CeO_2$, $Y_2O_3$, $InO_3$, $IrO_2$, $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, and $(Sr,Ca)RuO_3$.

As described above, in the present invention, the dielectric layers of the capacitor are composed of materials having high dielectric constants. This allows an area of the capacitor electrode to be reduced, and therefore the capacitor can be formed to have a relatively low height. Unlike the conventional method, therefore, the present invention does not require capacitors of high height to secure a sufficient capacitance value, thus enabling fabrication of the semiconductor devices with logic circuits, and thus fulfilling process compatibility.

The first and second upper electrodes 201 and 202, and the upper dielectric layer 190 are extended from the inner walls of the openings 151 and 152 to cover a top surface of the ILD pattern 155. In addition, the lower dielectric layer pattern 182 may be extended to cover the top surface of the ILD pattern 155 within a limited range of the logic circuit region.

According to the present invention, capacitors for logic circuits and capacitors for DRAMs have the same structure with the exception of the respective thicknesses of the dielectric layers. Thus, the capacitors for logic circuits and the capacitors for DRAMs may be formed simultaneously through the same cycle of process step.

In addition, the capacitors of the semiconductor device according to the present invention are disposed in an ILD beside a gate pattern. Thus, the capacitors can be formed by performing photolithographic and etching processes only twice. As a result, embedded memory logic (EML) semiconductor devices can be economically fabricated through simplified processes.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of fabricating a capacitor for a semiconductor device including a memory region and a logic circuit region, comprising:

forming an interlayer dielectric layer on a semiconductor substrate;

patterning the interlayer dielectric layer to form an interlayer dielectric layer pattern having first and second openings, which openings expose the semiconductor substrate of the memory region and the logic circuit region, respectively;

forming first and second lower electrodes on the first and second openings, respectively;

forming a lower dielectric layer pattern covering the second lower electrode; and sequentially forming an upper dielectric layer and an upper electrode layer on the surface of the resulting structure, including the interlayer dielectric layer, the first lower electrode, and the lower dielectric layer pattern.

2. The method as claimed in claim 1, comprising forming a heavily doped region in the semiconductor substrate under the first and second openings, before forming the interlayer dielectric layer.

3. The method as claimed in claim 1, wherein the first and second lower electrodes are composed of at least one material selected from the group consisting of titanium nitride, titanium, cobalt, tungsten, and ruthenium.

4. The method as claimed in claim 1, wherein forming the first and second lower electrodes comprises:

conformally forming a lower electrode layer on an entire surface of the semiconductor substrate including the first and second openings;

forming a sacrificial layer on the lower electrode layer;

successively etching the sacrificial layer and the lower electrode layer to expose a top surface of the interlayer dielectric layer pattern; and removing the sacrificial layer.

5. The method as claimed in claim 4, wherein the sacrificial layer is composed of at least one material selected from SOG materials and photoresist materials.

6. The method as claimed in claim 4, wherein removing the sacrificial layer is performed by using an etch recipe having an etch selectivity with respect to the interlayer dielectric layer pattern, and the first and second lower electrodes.

7. The method as claimed in claim 4, wherein removing the sacrificial layer is performed using a wet etch process.

8. The method as claimed in claim 1, wherein forming the lower dielectric layer pattern comprises:

conformally forming a lower dielectric layer on the resulting structure, including the first and second lower electrodes;

forming a mask pattern covering the lower dielectric layer disposed on the second lower electrode;

removing the lower dielectric layer covering the first lower electrode, by using the mask pattern as an etch mask; and removing the mask pattern.

9. The method as claimed in claim 8, wherein the lower dielectric layer covering the first lower electrode is removed using an isotropic etch process.

10. The method as claimed in claim 8, wherein the lower dielectric layer covering the first lower electrode is removed using an etch recipe having an etch selectivity with respect to the first lower electrode and the interlayer dielectric layer pattern.

11. The method as claimed in claim 1, wherein the lower dielectric layer pattern comprises at least one material layer selected from the group consisting of a tantalum oxide layer ($Ta_2O_5$), an aluminum oxide layer ($Al_2O_3$), a titanium oxide layer ($TiO_2$), a silicon oxide layer ($SiO_2$), a silicon nitride layer ($Si_3N_4$), and a hafnium oxide layer ($HfO_2$).

12. The method as claimed in claim 1, wherein the upper dielectric layer comprises at least one material layer selected from the group consisting of a tantalum oxide layer ($Ta_2O_5$), an aluminum oxide layer ($Al_2O_3$), a titanium oxide layer ($TiO_2$), a silicon oxide layer ($SiO_2$), a silicon nitride layer ($Si_3N_4$), and a hafnium oxide layer ($HfO_2$).

13. The method as claimed in claim 1, wherein the upper electrode layer is comprised of at least one material selected from the group consisting of titanium nitride, titanium, cobalt, tungsten, and ruthenium.

14. The method as claimed in claim 1, further comprising, after forming the upper electrode layer, patterning the upper electrode layer to form first and second upper electrodes crossing the first and second openings, respectively.

15. A capacitor of a semiconductor device including a memory region and a logic circuit region, comprising:

an interlayer dielectric layer pattern disposed on a semiconductor substrate, the interlayer dielectric layer pattern having first and second openings exposing the semiconductor substrate of the memory region and the logic circuit region, respectively;

a first lower electrode covering a sidewall and a bottom of the first opening;

a second lower electrode covering a sidewall and a bottom of the second opening;

a lower dielectric layer pattern on the second lower electrode;

an upper dielectric layer on the first lower electrode and the lower dielectric layer pattern;

a first upper electrode covering the upper dielectric layer at the first opening; and a second upper electrode covering the upper dielectric layer at the second opening.

16. The capacitor of the semiconductor device as claimed in claim 15, wherein the lower dielectric layer pattern comprises at least one material selected from the group consisting of a tantalum oxide layer ($Ta_2O_5$), an aluminum oxide layer ($Al_2O_3$), a titanium oxide layer ($TiO_2$), a silicon oxide layer ($SiO_2$), a silicon nitride layer ($Si_3N_4$), and a hafnium oxide layer ($HfO_2$).

17. The capacitor of the semiconductor device as claimed in claim 15, wherein the upper dielectric layer comprises at least one material selected from the group consisting of a tantalum oxide layer ($Ta_2O_5$), an aluminum oxide layer ($Al_2O_3$), a titanium oxide layer ($TiO_2$), a silicon oxide layer ($SiO_2$), a silicon nitride layer ($Si_3N_4$), and a hafnium oxide layer ($HfO_2$).

18. The capacitor of the semiconductor device as claimed in claim 15, wherein the first and second upper electrodes comprise at least one material selected from the group consisting of titanium nitride, titanium, cobalt, tungsten, and ruthenium.

19. The capacitor of the semiconductor device as claimed in claim 15, wherein the first and second lower electrodes comprise at least one material selected from the group consisting of titanium nitride, titanium, cobalt, tungsten, and ruthenium.

20. The capacitor of the semiconductor device as claimed in claim 15, further comprising a heavily doped region disposed in the semiconductor substrate under the first and second openings.

* * * * *